United States Patent
Ballinger et al.

(10) Patent No.: US 8,728,434 B2
(45) Date of Patent: May 20, 2014

(54) PREPARATION OF NANOCRYSTALS FOR THERMOELECTRIC AND SOLAR CELL APPLICATIONS USING SULFIDE-BASED NANOCRYSTAL PRECURSORS IN COLLOIDAL SYSTEMS

(71) Applicant: Evident Technologies, Troy, NY (US)

(72) Inventors: Clinton T. Ballinger, Ballston Spa, NY (US); Gregg Bosak, Hoosick Falls, NY (US); Katie Fiske, Petersburgh, NY (US); Luke Nally, Glenville, NY (US); Adam Z. Peng, Schenectady, NY (US); Susanthri Perera, Cohoes, NY (US); Alfred Waring, Saratoga Springs, NY (US)

(73) Assignee: Evident Technologies, Inc., Troy, NY (US)

( * ) Notice: Subject to any disclaimer, the term of this patent is extended or adjusted under 35 U.S.C. 154(b) by 0 days.

(21) Appl. No.: 13/930,300

(22) Filed: Jun. 28, 2013

(65) Prior Publication Data
US 2014/0010750 A1    Jan. 9, 2014

Related U.S. Application Data

(60) Provisional application No. 61/665,350, filed on Jun. 28, 2012.

(51) Int. Cl.
*C01B 17/20* (2006.01)
*C01B 19/00* (2006.01)
*C01G 29/00* (2006.01)
*C01G 30/00* (2006.01)
*B82Y 30/00* (2011.01)

(52) U.S. Cl.
CPC ............. *C01B 19/00* (2013.01); *C01B 17/20* (2013.01); *C01B 19/007* (2013.01); *B82Y 30/00* (2013.01); *Y10S 977/773* (2013.01); *Y10S 977/81* (2013.01)
USPC ............ 423/508; 423/511; 977/773; 977/810

(58) Field of Classification Search
CPC ...... C01B 19/00; C01B 17/20; C01B 19/007; B82Y 30/00
USPC ............................ 423/508, 511; 977/773, 810
See application file for complete search history.

(56) References Cited

U.S. PATENT DOCUMENTS

| | | | | |
|---|---|---|---|---|
| 6,833,083 | B2 * | 12/2004 | Imai et al. .................. | 252/62.3 T |
| 2009/0250651 | A1 * | 10/2009 | Rhyee et al. ............... | 252/62.3 T |
| 2011/0247671 | A1 * | 10/2011 | Kim et al. .................... | 136/238 |
| 2012/0145212 | A1 * | 6/2012 | Purkayastha et al. ......... | 136/200 |
| 2013/0140504 | A1 * | 6/2013 | Rowe et al. ................. | 252/519.4 |
| 2013/0298954 | A1 * | 11/2013 | Ahn et al. .................... | 136/205 |

* cited by examiner

Primary Examiner — Timothy Vanoy
(74) Attorney, Agent, or Firm — Hoffman Warnick LLC

(57) ABSTRACT

Disclosed herein is a method of synthesizing a nanocrystal. The method can include reacting a bismuth material, an antimony material, and a ligand together with a heat source. The method may also include injecting a sulfur precursor at a predetermined temperature and maintaining the predetermined temperature for a predetermined amount of time to form a plurality of precursor nanocrystals. The precursor nanocrystals may include $Bi_{0.5}Sb_{1.5}S_3$ nanocrystals.

19 Claims, 2 Drawing Sheets

PREPARATION OF NANOCRYSTALS FOR THERMOELECTRIC AND SOLAR CELL APPLICATIONS USING SULFIDE-BASED NANOCRYSTAL PRECURSORS IN COLLOIDAL SYSTEMS

FIELD OF THE INVENTION

Embodiments of the present invention relate generally to methods of preparing nanocrystals using sulfide-based nanocrystals as precursors in colloidal systems in order to improve thermoelectric and solar cell applications.

BACKGROUND OF THE INVENTION

Semiconductor materials are utilized in a broad range of applications including, but not limited to, logic gates, sensors, solar cells, and thermoelectric devices. These materials are typically produced using epitaxial or other crystal growth methods and serve as the backbone of modern electrical applications. Due to crystal growth techniques, the underlying semiconductor materials are most often in the form of a flat wafer that is rigid and fragile. These semiconductor wafers are processed using lithography or other methods to produce a final device. An alternative method for producing a semiconductor material is to use colloidal growth techniques to produce semiconductor nanocrystals. These nanocrystals are often grown as a suspension in a solvent and may have stoichiometries that are the same as or very similar to their traditional, epitaxial counterparts.

Recent research has focused on developing an optimal material system for thermoelectric and solar cell applications. The ideal material structure exhibits a discrete distributed density of electron states which is best formed by a nanostructured material constructed of discrete semiconductor nanocrystals. Creating this ideal material structure has proven to be a challenge because of the complexity of getting a uniform stoichiometry and morphology across the entire material. Creating chemical reactions that result in scalable, controllable, nano-sized semiconductor particles is also very difficult.

Previous attempts have included forming $Bi_2S_3$ nanocrystals, and then performing an ionic exchange with $Sb_2Te_3$ in the presence of excess Te to form $BiSbTe_3$ nanocrystals. This method was preferred due to easy to control kinetics of the reaction and the ease of scaling the process. However, the nanocrystals synthesized according to these methods tend to have Bi-rich and Sb-rich phases within the final material. These prior methods essentially form a core of $Bi_2Te_3$ with a shell of $Sb_2Te_3$. The final material stoichiometry may match the ideal target stoichiometry, but there are nano-sized phases of different material stoichiometries within the overall material that may inhibit the thermoelectric or solar cell performance characteristics.

BRIEF DESCRIPTION OF THE INVENTION

Embodiments of the invention disclosed herein may include a method of synthesizing a nanocrystal comprising: reacting a bismuth material, an antimony material, and a ligand together with a heat source; injecting a sulfur precursor at a predetermined temperature; and maintaining the predetermined temperature for a predetermined amount of time to form a plurality of precursor nanocrystals, the precursor nanocrystals comprising $Bi_{0.5}Sb_{1.5}S_3$ nanocrystals.

Embodiments of the invention may also include a composition of matter including a plurality of $Bi_{0.5}Sb_{1.5}S_3$ nanocrystals, the composition of matter synthesized using a method comprising: reacting a bismuth material, an antimony material, and a ligand together with a heat source; injecting a sulfur precursor at a predetermined temperature; and maintaining the predetermined temperature for a predetermined amount of time to form a plurality of precursor nanocrystals, the precursor nanocrystals comprising $Bi_{0.5}Sb_{1.5}S_3$ nanocrystals.

Embodiments of the invention may also include a nanocrystal having the formula $BiSbTe_3$, wherein the ratio of Bi, Sb, and Te to one another is substantially uniform throughout the entire nanocrystal.

BRIEF DESCRIPTION OF THE DRAWINGS

These and other features of the disclosure will be more readily understood from the following detailed description of the various aspects of the invention taken in conjunction with the accompanying drawings that depict various aspects of the invention.

Figure 1:
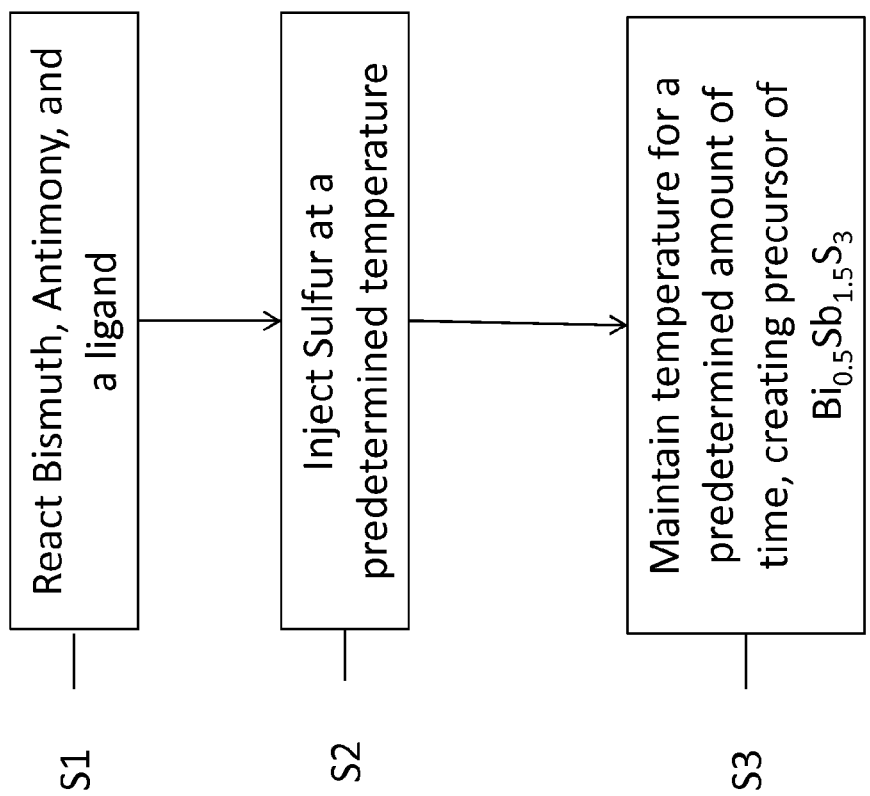
FIG. 1 illustrates a flow chart of a method according to some embodiments of the invention.

It is noted that the drawings may not be to scale. The drawings are intended to depict only typical aspects of the invention, and therefore should not be considered as limiting the scope of the invention. In the drawings, like numbering represents like elements between the drawings. The detailed description explains embodiments of the invention, together with advantages and features, by way of example with reference to the drawings.

DETAILED DESCRIPTION OF THE INVENTION

Embodiments of the present invention include a new method and material, which can ultimately allow for a more uniform final material than known methods. According to some embodiments, nanocrystals of $Bi_{1-x}Sb_{3-x}S_{6-x}$, such as $Bi_{0.5}Sb_{1.5}S_3$, are synthesized and utilized as a novel precursor material which will subsequently be converted into a $BiSbTe_3$ material using a Te-rich ionic exchange. This new $BiSbTe_3$ material made using embodiments of the invention may have a more uniform stoichiometry throughout the nanocrystal and may lead to better performance in some devices, for instance, a thermoelectric device or a solar cell.

To further explain the meaning of uniform stoichiometry, by way of example, previous methods have resulted in nano-sized phases of different material stiochiometries, or ratios of the elemental components, within the material. A core of one stoichiometry would have an outer portion, or more than one, of another stoichiometry. When averaged together, the total stoichiometry can appear similar to the desired stoichiometry, but the material will not work as desired due to these different material systems within a single material. However, using methods described below and the above disclosed precursor material, a final stoichiometry that is uniform throughout the material can be achieved.

Turning to the figures, a method for creating semiconductor nanocrystals with consistent stoichiometry throughout the material is disclosed. This method can be interpreted as involving two-fold process. For instance, in FIG. 1, a first portion of a method may include synthesizing sulfide-based nanocrystals. These nanocrystals, by virtue of the material, can often be easier to control in regards to the reaction kinetics. As the reaction kinetics may be easier to control, the size of the resulting nanocrystals may also be more controllable. Once these sulfide nanocrystals are formed, a second portion of a method, as illustrated in FIG. 2, may include exchanging the sulfur ions of the nanocrystal with tellurium ions, which may be referred to as an ionic exchange step. This process can result in a material that is nanocrystalline with the correct stoichiometry throughout the entirety of the nanocystaline structure, which also contains very little sulfur residue and has a uniform stoichiometry.

Referring back to FIG. 1, the method, according to some embodiments, may include, as illustrated at S1, reacting a bismuth material source and an antimony material source together. This may be done in the presence of a ligand. Any now known or later developed ligand structure capable of being used with semiconductor nanocrystals may be chosen. Once mixed, this solution may be heated by any known heat source. This heating may take place under a vacuum, an inert gas, or a combination thereof. As illustrated at S2, once the reaction has been heated to a temperature of approximately 100° C. to approximately 150° C., a sulfur precursor source may be injected into the heated solution. In some embodiments, the predetermined temperature can include about 130° C. Once injected, the solution including sulfur may be allowed to incubate, e.g., maintained at the predetermined temperature. The incubation period can vary, but in some embodiments may be for approximately two to approximately twelve minutes, or in some embodiments may include approximately 5 minutes. The length of time can be varied, for instance, in order to vary the size of the resulting nanocrystals. This incubation can result in the synthesis of $Bi_{0.5}Sb_{1.5}S_3$ nanocrystals, which can be used as precursor nanocrystals. In some embodiments, the nanocrystal may begin to precipitate out of solution on its own following the incubation procedure.

According to one embodiment, this method produces nanocrystals with a stoichiometry comprising $Bi_{0.5}Sb_{1.5}S_3$. Although these nanocrystals may be synthesized in a colloidal system, i.e., colloidally grown as outlined above and in FIG. 1, the $Bi_{0.5}Sb_{1.5}S_3$ particles often do not stay in solution for a very long period following synthesis, and therefore may precipitate out of solution and to the bottom of the flask. The particles can be larger in size than some traditional nanocrystals such as quantum dots. Thus, they may not remain in suspension, despite the use of organic ligands in the synthesis. Nanocrystals not remaining in suspension may be considered a fault in some applications, but in these embodiments it may be acceptable because subsequent ionic exchange steps can work well to create a desirable material composition, regardless of suspension.

Turning to FIG. 2, in some embodiments, the precursor nanocrystals may then undergo at least one, and perhaps a plurality of washing steps as illustrated at S4. Following the washing steps, or in some embodiments, in conjunction with the washing steps, an ionic exchange or a plurality of ionic exchanges, illustrated at S5, can be performed in order to form a $BiSbTe_3$ material, which can then be isolated at S6. The washing at S4 may include any now known methods or later developed methods to isolate the nanocrystals and clean any impurities from them. During the washing, the ionic exchange, or both, the material at that point, whether precursor nanocrystals, $BiSbTe_3$ nanocrystals, or somewhere between, in further embodiments, may also be sonicated, for instance in a sonicator, during the washing and ionic exchange steps. The sonication may aid in removing impurities from the material. As a further benefit, sonication can aid in a thorough or full ionic exchange.

For the at least one ionic exchange at S5, a number of ions or combinations of ions, in one or more steps, can be used in order to exchange the S for Te, as well as adjusting the stoichiometry to a preferred ratio. In one embodiment, an ionic exchange utilizing Sb and Bi may be added to the precursor nanoccrystals at a known ratio, for instance a 4:1 ratio. This will alter the overall stoichiometry, and can result in a final ratio of about 2:1 to about 5:1, or more particularly 3.5:1, of Sb:Bi. In other embodiments, any other suitable stoichiometry can be achieved using the proper ionic exchange, depending on the desired properties of the material. In some embodiments, at least a second ionic exchange can take place. In one embodiment, a Te source, such as an SbTe ink, can be utilized. In one embodiment, in a final ratio of 3:1 to about 6:1, or more particularly, 4:1 of Sb:Bi may be desirable. The final nanocrystal may comprise $BiSbTe_3$ nanocrystals, as the Te may be quite efficient at replacing the sulfur in the nanocrystals, resulting in a full ionic exchange. The size of the nanocrystals can be varied by altering the parameters of the reaction, for instance by altering the temperature at which incubation occurs, the time of the incubation, or both. The size of the $BiSbTe_3$ nanocrystals may be greater than about 1 nm and less than about 100 nm. The disclosed method can result in uniformly doped ions throughout all of the crystal sites within the nanocrystals, and thus a uniform stoichiometry. This method also enhances the material transport properties of the nanocrystals for thermoelectric and solar applications.

Figure 2:
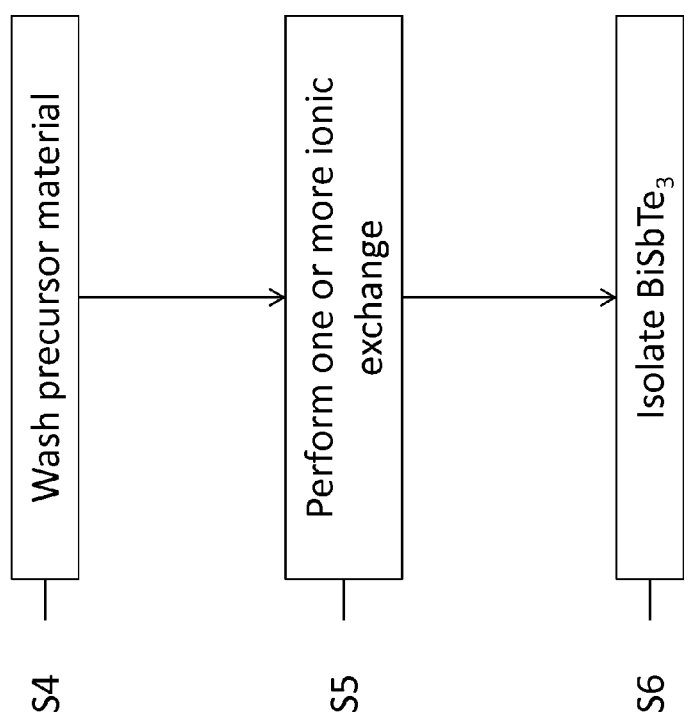
FIG. 2 illustrates a flow chart of a method according to some embodiments of the invention.

The foregoing flow charts of FIGS. 1 and 2 show some synthesis steps of preparing nanocrystals according to certain embodiments of the disclosure. In this regard, each block in the figures represents a preparation act associated with the synthesis. It should be noted that in some alternative implementations, the acts noted in the blocks may occur out of the order noted in the figures or, for example, may in fact be executed concurrently or in the reverse order, depending on the act involved.

EXAMPLE 1

Synthesis of Precursor Nanocrystal

In one example method, bismuth acetate, antimony acetate, and a ligand are heated under a combination of vacuum and inert gas. At approximately 130° C., a sulfur precursor is injected and allowed to incubate for approximately five minutes. After the $Bi_{0.5}Sb_{1.5}S_3$ nanocrystals are synthesized following the five minute incubation, they undergo a series of washing steps and ionic exchanges to form $BiSbTe_3$. During the ionic exchange, a 4:1 ratio of Sb:Bi is added, resulting in a final ratio of 3.5:1 Sb:Bi. A second ionic exchange of SbTe ink is necessary to give the final ratio of 4:1 Sb:Bi. The final particle size of the $BiSbTe_3$ is greater than 1 nm and less than 100 nm.

In another embodiment, the disclosure includes a composition of matter, including a plurality of $Bi_{0.5}Sb_{1.5}S_3$ nanocrystals, which can be made by the method disclosed above. Another embodiment includes a nanocrystal having the formula $BiSbTe_3$, wherein the ratio of Bi, Sb, and Te to one another is substantially uniform throughout the entire nanocrystal. The above disclosed methods can be useful in creating this nanocrystal.

In further embodiments, more than one starting precursor nanocrystal may be used. Multiple starting precursor materials can reduce the difficulty of fully and uniformly doping the material system during an ionic exchange. In some embodiments, the two starting materials are both in the form of sulfide-based nanocrystals. The sulfur can be removed in further processing to form desirable material system complexes. Ions can be uniformly doped into the whole crystal sites, allowing for enhanced thermoelectric transport properties.

The methods disclosed herein can be useful for other material systems not discussed. The methods can also easily be transferred to desirable systems for a wide temperature range of thermoelectric applications and for various solar cell applications.

The foregoing description of various aspects of the invention has been presented for the purpose of illustration and description. It is not intended to be exhaustive or to limit the invention to the precise form disclosed, and obviously, many modifications and variations are possible. Such variations and modifications that may be apparent to one skilled in the art are intended to be included within the scope of the present invention as defined by the accompanying claims.

What is claimed:

1. A method of synthesizing a nanocrystal comprising:
   reacting a bismuth material, an antimony material, and a ligand together with a heat source;
   injecting a sulfur precursor at a predetermined temperature; and
   maintaining the predetermined temperature for a predetermined amount of time to form a plurality of precursor nanocrystals, the precursor nanocrystals comprising $Bi_{0.5}Sb_{1.5}S_3$ nanocrystals.

2. The method of claim 1, wherein the reacting is done under a vacuum, an inert gas, or a combination thereof.

3. The method of claim 1, wherein the injecting is done at a temperature of approximately 100° C. to approximately 150° C.

4. The method of claim 3, wherein the temperature is approximately 130° C.

5. The method of claim 1, wherein the predetermined amount of time includes approximately 2 minutes to approximately 12 minutes.

6. The method of claim 5, wherein the predetermined amount of time includes approximately 5 minutes.

7. The method of claim 1, further comprising:
   washing the plurality of precursor nanocrystals.

8. The method of claim 1, further comprising:
   performing at least one ionic exchange, wherein a Te containing material is added to the plurality of precursor nanocrystals; and
   isolating a plurality of $BiSbTe_3$ nanocrystals.

9. The method of claim 8, wherein the performing at least one ionic exchange includes:
   performing a first ionic exchange with a SbBi material; and
   performing a second ionic exchange with a SbTe material.

10. The method of claim 8, wherein the plurality of $BiSbTe_3$ nanocrystals have a substantially uniform stoichiometry throughout the entirety of each nanocrystal.

11. A composition of matter including a plurality of $Bi_{0.5}Sb_{1.5}S_3$ nanocrystals, the composition of matter synthesized using a method comprising:
   reacting a bismuth material, an antimony material, and a ligand together with a heat source;
   injecting a sulfur precursor at a predetermined temperature; and
   maintaining the predetermined temperature for a predetermined amount of time to form a plurality of precursor nanocrystals, the precursor nanocrystals comprising $Bi_{0.5}Sb_{1.5}S_3$ nanocrystals.

12. The composition of matter of claim 11, wherein the reacting is done under a vacuum, an inert gas, or a combination thereof.

13. The composition of matter of claim 11, wherein the injecting is done at a temperature of approximately 100° C. to approximately 150° C.

14. The composition of matter of claim 13, wherein the temperature is approximately 130° C.

15. The composition of matter of claim 11, wherein the predetermined amount of time includes approximately 2 minutes to approximately 12 minutes.

16. The composition of matter of claim 15, wherein the predetermined amount of time includes approximately 5 minutes.

17. The composition of matter of claim 11, further comprising:
   washing the plurality of precursor nanocrystals.

18. The composition of matter of claim 11, wherein the $Bi_{0.5}Sb_{1.5}S_3$ nanocrystals are synthesized in a colloidal suspension and precipitate out of the colloidal suspension following the synthesis.

19. A nanocrystal having the formula $BiSbTe_3$, wherein the ratio of Bi, Sb, and Te to one another is substantially uniform throughout the entire nanocrystal.

* * * * *